United States Patent
McKellar

(10) Patent No.: US 10,406,526 B1
(45) Date of Patent: *Sep. 10, 2019

(54) CONVERTIBLE HOTPLATE ADAPTER FOR ROUNDED VESSELS AND THE LIKE

(71) Applicant: Bernard Robert McKellar, Dallas, TX (US)

(72) Inventor: Bernard Robert McKellar, Dallas, TX (US)

(*) Notice: Subject to any disclaimer, the term of this patent is extended or adjusted under 35 U.S.C. 154(b) by 185 days.

This patent is subject to a terminal disclaimer.

(21) Appl. No.: 15/246,733

(22) Filed: Aug. 25, 2016

Related U.S. Application Data

(60) Provisional application No. 62/210,112, filed on Aug. 26, 2015.

(51) Int. Cl.
| | |
|---|---|
| *H05B 3/68* | (2006.01) |
| *B01L 7/00* | (2006.01) |
| *B01L 9/00* | (2006.01) |
| *B01F 13/08* | (2006.01) |
| *B01F 15/06* | (2006.01) |

(52) U.S. Cl.
CPC ............ *B01L 7/00* (2013.01); *B01F 13/0818* (2013.01); *B01F 15/065* (2013.01); *B01L 9/00* (2013.01); *B01F 2015/062* (2013.01); *B01F 2215/0037* (2013.01); *B01L 2300/06* (2013.01); *B01L 2300/0609* (2013.01); *B01L 2300/0627* (2013.01); *B01L 2300/0832* (2013.01); *B01L 2300/12* (2013.01); *B01L 2300/18* (2013.01)

(58) Field of Classification Search
CPC .......... B01L 7/00; B01L 9/00; B01F 13/0818; B01F 15/065; B01F 15/0072; B65D 81/3227; B65D 81/3244; B65D 21/02; B65D 21/0202; B65D 21/0233; H05B 3/68
USPC ................. 422/500, 557, 560, 562; 366/146, 366/273–274, 281, 284–286, 289, 293; 222/181; 220/23.86, 23.87, 23.88, 506
See application file for complete search history.

(56) References Cited

U.S. PATENT DOCUMENTS

| | | | | |
|---|---|---|---|---|
| 4,568,192 A * | 2/1986 | Kudermann | ........ | B01F 13/0818 219/433 |
| 5,834,739 A * | 11/1998 | Lockwood | .......... | A47J 43/0465 219/468.1 |
| 2004/0218468 A1* | 11/2004 | Terentiev | .............. | A61M 1/127 366/273 |
| 2006/0165851 A1* | 7/2006 | Brizio | ................... | A47J 31/005 426/106 |
| 2008/0083741 A1* | 4/2008 | Giddings | ................. | H05B 3/42 219/534 |

(Continued)

*Primary Examiner* — Brian R Gordon
(74) *Attorney, Agent, or Firm* — Ice Miller LLP

(57) ABSTRACT

The present invention is an article or device to facilitate the heating of rounded vessels and other rounded objects comprising a plurality of nested, concentric hollow cylinders each having respective upper edges and inner sides and adapted to be arranged and fixed in at least two configurations such that the upper edges and inner sides of the hollow cylinders form at least two bowl-shaped contours. Also included is a device for taking the impetus of a first rotating magnetic field to create the impetus of a second rotating magnetic field at some distance from the first rotating magnetic field, in order for the impetus of second magnetic field to stir the contents of a vessel by means of a magnet placed in the vessel.

23 Claims, 11 Drawing Sheets

(56) References Cited

U.S. PATENT DOCUMENTS

2011/0072978 A1* 3/2011 Popescu ................. A47G 19/14
99/288
2013/0181000 A1* 7/2013 Miksovsky ............... A45F 3/20
220/780
2014/0349385 A1* 11/2014 Erdenberger ..... B01F 15/00714
435/302.1
2016/0320269 A1* 11/2016 Hilliard ................... G01N 1/04

* cited by examiner

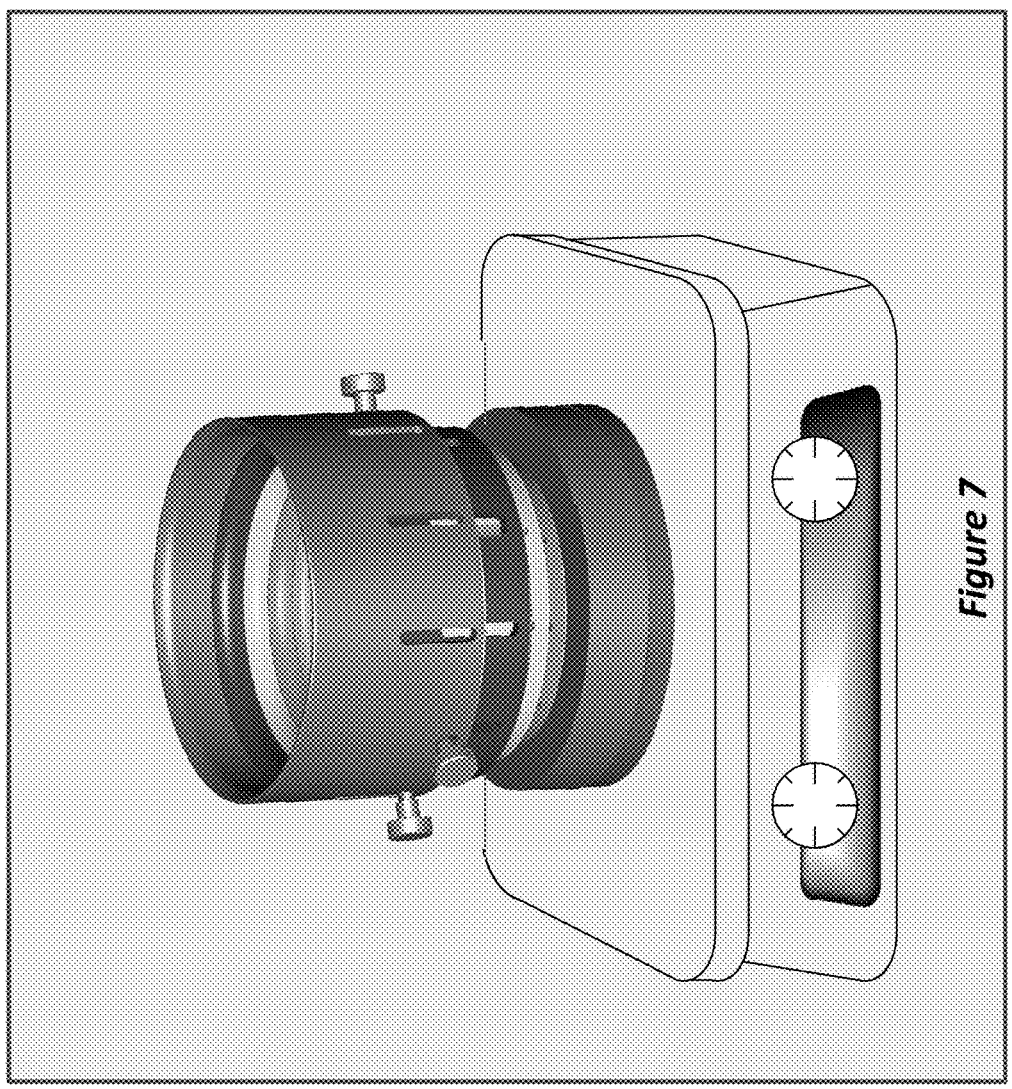

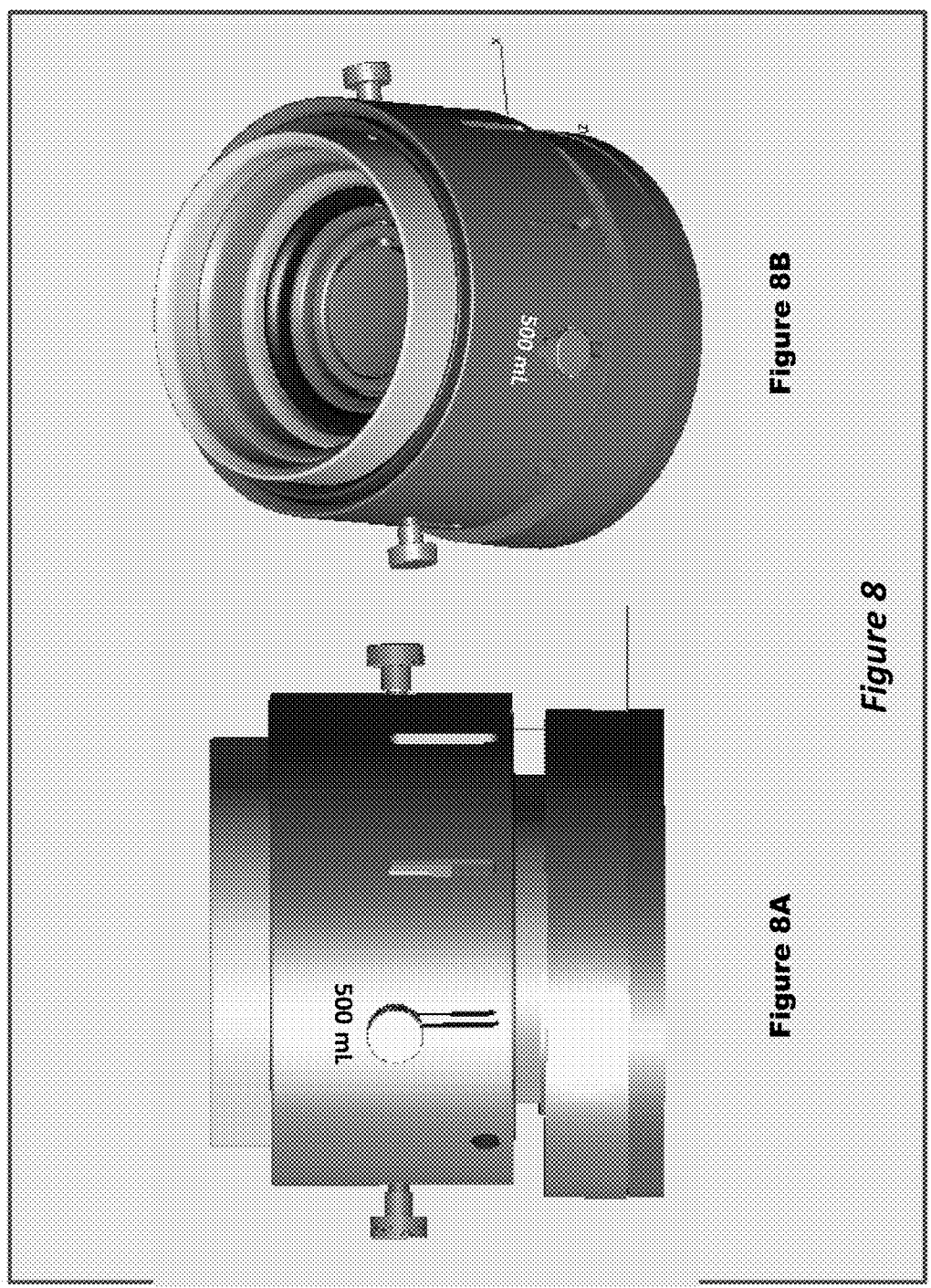

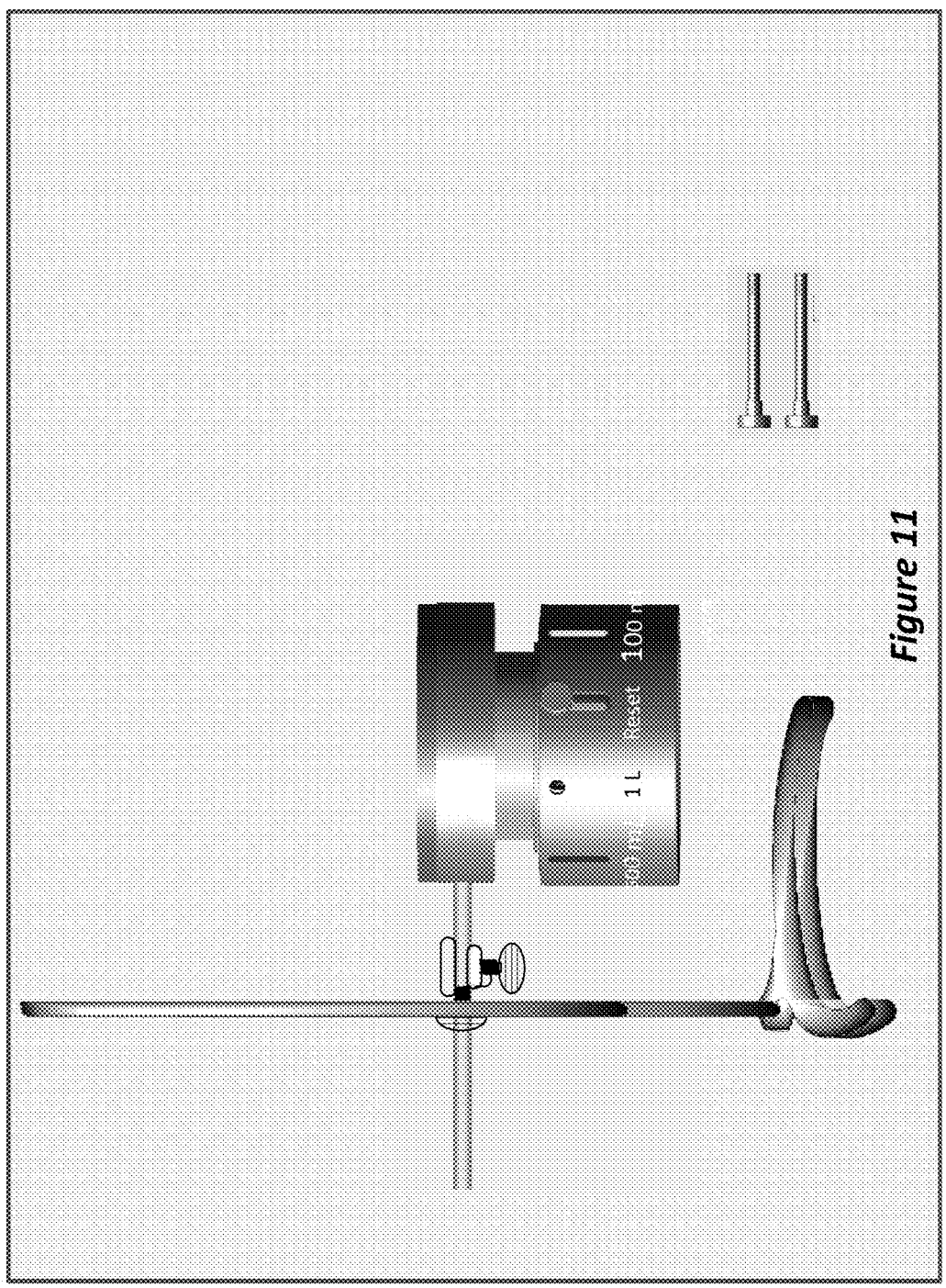

CONVERTIBLE HOTPLATE ADAPTER FOR ROUNDED VESSELS AND THE LIKE

RELATED APPLICATION DATA

This application claims the priority benefit of U.S. Provisional Application Ser. No. 62/210,112, filed Aug. 26, 2015, which is hereby incorporated in its entirety herein by reference.

BACKGROUND OF THE INVENTION

A very common laboratory operation is heating a round-bottomed flask or other round-bottomed vessel. Flasks can be heated with a flame from a burner but this is very hazardous when associated with flammable solvents often found in laboratories. Steam baths are safer but require a source of steam and this method is otherwise usually not favored due to complications from liquid water present in steam lines, the need to drain condensate water from the bath and temperature control limitations.

Most commonly today, round-bottomed vessels are heated either with heating mantles or with fluid-filled baths placed on electrical heat sources such as hotplates. Heating mantles are typically constructed from woven-glass-fiber fabric and from glass wool stuffing enclosing a resistance wire or other heating element. Usually the heating mantle is constructed to form a rounded pocket and sized to closely fit the contours of a flask of a certain capacity such as 100 ml, 500 mL, 1 L, 20 L, etc. Consequently, a different heating mantle is required for each size of flask which will likely be heated in the course of laboratory operations and thus an investment in a number of heating mantles is often required. In addition, typically required is a voltage regulating device such as a variable transformer in order to regulate the heat output of the heating mantle. Adjusting such a device to the proper voltage output to achieve a steady temperature is often a matter of trial-and-error. To automatically maintain a temperature set-point may require an additional, separate piece of equipment. To magnetically stir the contents of the round-bottomed flask typically requires a rotating-magnet device placed under the heating mantle and a magnetic follower in the vessel. However even with such an arrangement of rotating-magnet device, heating mantle and magnetic follower, satisfactory stirring can fail as the thickness of the heating mantle will separate the rotating magnet from the magnetic follower to the extent that interaction and synchronization of the two magnets is poor.

A fluid-filled bath set on a hotplate can serve as a medium of heat conduction between a flat heating surface and a round-bottomed vessel placed in the bath. Temperature control is usually simpler than with a heating mantle since hotplates often feature digital temperature controls and a thermocouple probe which may be placed in the fluid-filled bath or in the vessel, itself. The bath may be filled with several types of fluids but silicone oil is preferred since it is non-flammable and can be found in grades which are both high boiling and have high decomposition temperatures. The negative aspects of using an oil bath include: spillage, the need to adjust the bath oil level for the displacement of different sized vessels and the need to adjust fluid levels for optimal magnetic stirring height. Any water contamination of the oil will cause the oil spattering when the bath is later heated above the boiling point of water. Spillage can occur due to moving and storage of liquid-filled vessels, tipping of fluid-filled baths on jacks or platforms, overflowing due to the thermal expansion of the liquid, cracking or breaking of glass baths and so forth.

Aluminum blocks are found which are formed with both bowl-shaped cavities to receive rounded vessels and with flat bottoms to sit flat on a hotplate. Like heating mantles these aluminum heating blocks are specifically sized for each size of vessel and thus a considerable cost is incurred in obtaining several heating blocks for several different sizes of vessels. Devices which integrate heating blocks with hotplate-type controllers are also available and are purportedly able to accommodate up to three sizes of round vessels. But their utility is typically limited to rounded vessels, because, lacking a flat heating surface, they typically cannot be used as a typical hotplate is used.

Consequently a device is needed which will sit on a hot plate device and transmit heat to a round-bottomed vessel or other rounded apparatus. Further it is desirable for such a device to allow magnetic stirring of the contents of the said vessel by means of a magnetic follower placed in the flask. Further it is desirable that such a device be easily adaptable to round bottomed vessels of various sizes and that it be relatively inexpensive to manufacture and easy to use.

SUMMARY OF THE INVENTION

The present invention includes an article or device to facilitate the heating of rounded vessels and other rounded objects comprising a plurality of nested, concentric hollow cylinders each having respective upper edges and inner sides and adapted to be arranged and fixed in at least two configurations such that said upper edges and inner sides of said hollow cylinders form at least two bowl-shaped contours.

In one embodiment, the article or device includes concentric hollow cylinders that comprise a heat-conducting metal selected from the group consisting of silver, copper, bronze, titanium, aluminum and aluminum alloys. The heat-conducting metal may be polished or anodized or colored. In one embodiment, the heat-conducting metal is of a relatively low magnetic permeability (mu).

In another embodiment, the article or device additionally comprises a solid cylindrical core that may present a flat or concave rounded upper face.

In another embodiment, the cylindrical core comprises a mechanism for creating a rotating magnetic field for purposes of stirring a vessel containing a magnet and disposed on the contour formed by the concentric hollow cylinders.

In still another embodiment, the concentric hollow nested cylinders comprise cut-out slots or holes radially aligned through at least some of the concentric hollow nested cylinders such that when a rod is placed through the proper set of cut-out slots or holes said concentric hollow nested cylinders will come to rest at an appropriate height such that the combination of nested cylinder's upper edges and inner sides will form a profile to conform to the profile of a vessel or other object preferably a rounded or spherical vessel such as a round-bottomed flask or other object. In another variant of this embodiment the nested hollow concentric cylinders are provided with two or more sets of cut-out slots or holes radially aligned through most or all of the cylinders such that, when a rod is removed from one set of cut-out slots or holes whose combination of nested cylinders' upper edges and inner sides have formed one particular profile and then the rod is placed in a different set of slots or holes, the weight of the cylinders will cause each cylinder to come to rest at an appropriate height such that a different profile will be formed from the nested cylinders' upper edges and inner sides.

In yet another variant of this embodiment, the nested concentric cylinders are provided with two or more sets of cut-out slots or holes radially aligned through most or all of the cylinders and with a rod or rods permanently or semi-permanently placed in a certain set of slots or holes such that when the device is inverted, the nested cylinders will each fall under its weight and hang on the permanent or semi-permanent rod in a "reset" position thus allowing a second rod to be inserted in another set of slots or holes such that when the device is turned back to the upright position, the cylinders will then fall in the opposite direction to form a pre-set profile determined by slots where the second rod is placed.

In still another variant of this embodiment, the article or device additionally comprises a relatively thick hollow pedestal cylinder ring, typically from ¼ to 4 inches in height along the cylinder's axis and with a difference in inner and outer diameters of typically ¼ to 3 inches, and composed of a heat conducting material, preferably aluminum, with the purpose of facilitating heat transfer from a flat heating surface (such as that of a hot plate) to the concentric hollow rings of the device, and then, in turn, to a round or irregular object to be heated, such as a round-bottom flask.

In still another variant of this embodiment, the article or device additionally comprises a disk composed of heat-conducting material, preferably aluminum to which the hollow pedestal base and central shaft of the device may be anchored by screws, bolts or other attachments.

The present invention also includes a device or machine for taking the impetus of a first rotating magnetic field to create the impetus of a second rotating magnetic field at some distance from the first rotating magnetic field, in order for the impetus of second magnetic field to stir the contents of a vessel by means of a magnet placed in the vessel.

In another embodiment, the device or machine comprises two or more magnets fixed to a common axle or shaft such that the alignment of the poles of each magnet is perpendicular to the axle or shaft. In another variant of this embodiment, the alignment of the axle is perpendicular to the plane of the first revolving magnetic field. In yet another variant of this embodiment, the device or machine comprises a hollow cylindrical axle such that the axle may revolve around a fixed central shaft.

Typically, magnets with use temperatures greater than 150° C. are used with the present invention, such as, for instance, samarium cobalt, or similar rare-earth, high-use temperature magnetically susceptible material. In one embodiment, the magnets are ring shaped or round, and diametrically polarized, i.e., magnetized along the diameter of the disk or ring.

In one embodiment of the invention, the device or machine includes high-temperature thrust-bearing assemblies to support the axle rotation. In still another embodiment of the invention, one or more ball-bearing assemblies are disposed between the stationary shaft and axle to facilitate rotation.

The present invention also includes arrangements wherein the concentric hollow nested cylinders are supported by a laboratory stand above a working surface, and wherein the concentric hollow nested cylinders are supported on the surface of a flat heating element, such as a hot plate, and also wherein the concentric hollow nested cylinders are arranged so as to support a container, such as a round bottom flask.

The present invention includes the use of the article or device to support, heat and/or stir the contents of a round-bottom flask or similar container, and the sequential use of the article or device to support, heat and/or stir the contents of a series of round-bottom flask or similar containers of varying bottom shape or size that may be accommodated by the article or device of the present invention. Such use may proceed from determining or estimating the dimensions and/or shape of the flasks, adjusting the article or device to support the flask, and supporting, heating and/or stirring the contents of the flask once provided to the flask and positioned in a laboratory stand, on a hot plate or other heating element or in proximity to a magnetic stirrer, such as those incorporated into the present invention.

BRIEF DESCRIPTION OF THE FIGURES

While the specification concludes with claims particularly pointing out and distinctly claiming the present invention, it is believed that the present invention will be better understood from the following description in conjunction with the accompanying Drawing Figures, in which like reference numerals identify like elements, and wherein:

FIG. 7 is a lateral elevation view of a convertible hotplate adapter positioned on a hot plate, in accordance with aspects of the present invention.

FIGS. 8A and 8B are respectively a lateral elevation view and upper perspective view of a convertible hotplate adapter in accordance with aspects of the present invention.

FIG. 11 is a lateral elevation view of a convertible hotplate adapter suspended by the suspension rod from a laboratory ring stand in an inverted position whereby the nested concentric hollow-cylinders fall into the "reset" position in accordance with aspects of the present invention.

DETAILED DESCRIPTION OF THE PREFERRED EMBODIMENTS OF THE INVENTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

Figure 1:
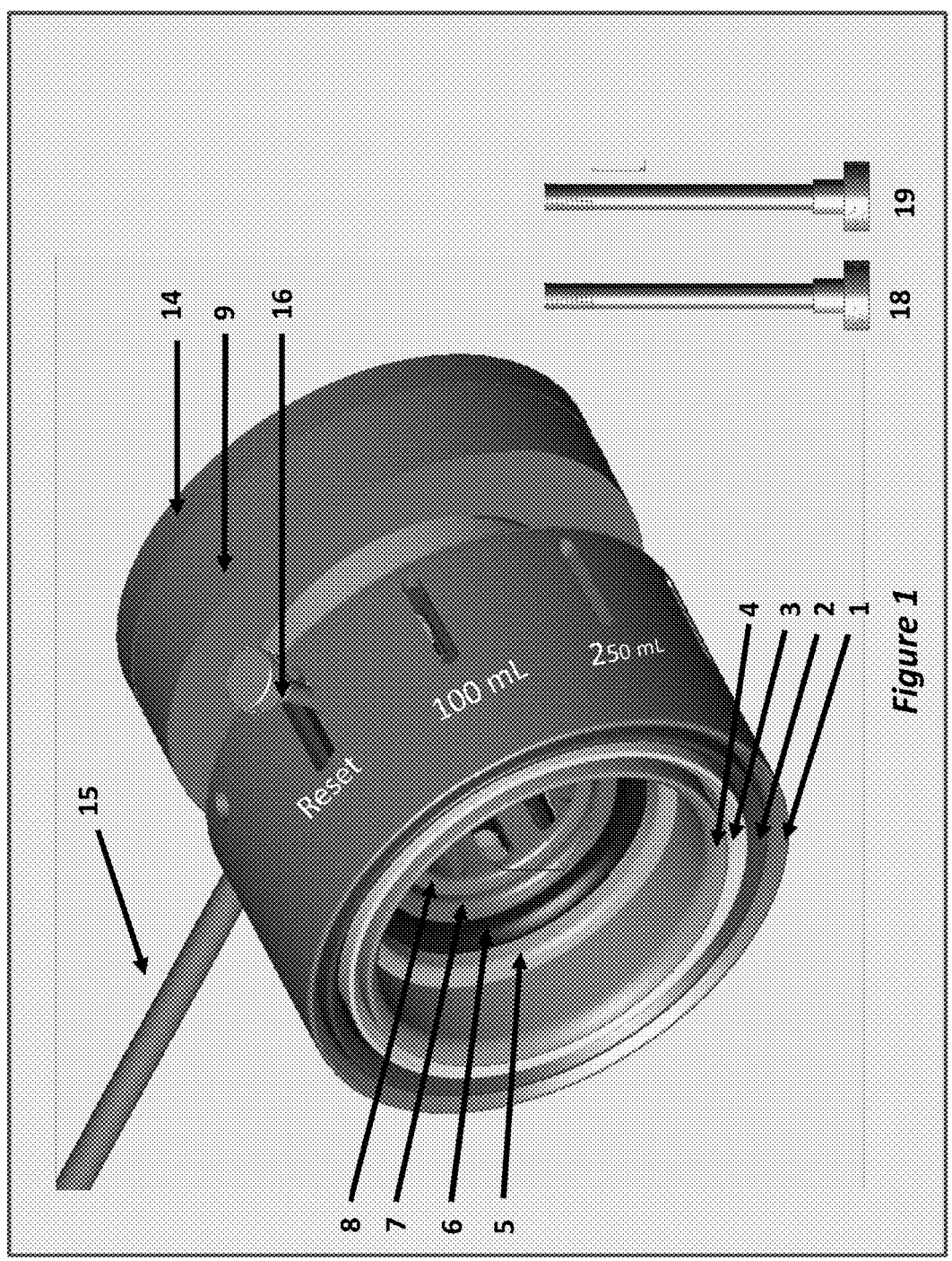
FIG. 1 is a lateral perspective view of a convertible hotplate adapter in accordance with aspects of the present invention.

FIG. 1 illustrates one embodiment of the present invention comprising four outer concentric hollow-cylinder rings (1, 2, 3 and 4) closely nested together such that the gap between adjacent rings is about 3 mm or less. The thickness is about 5 mm or, in other words, the difference between the inner and outer diameters of each hollow-cylinder ring is approximately 10 mm. Each of the four outer hollow-cylinder concentric rings is about 75 mm in height. The outermost hollow cylinder (1) is about 140 mm in outer diameter. The second outermost hollow cylinder (2) is about 128 mm in outer diameter. The third outermost hollow cylinder (3) is about 117 mm in outer diameter. The fourth outermost hollow-cylinder (4) is about 105 mm in outer diameter.

This embodiment of the invention also comprises four inner concentric hollow-cylinder rings (5, 6, 7 and 8) closely nested together such that the gap between adjacent rings is about 3 mm or less. The thickness is 5 mm or, in other words the difference between the inner and outer diameters of each hollow-cylinder ring is approximately 10 mm. Each of the four inner hollow-cylinder concentric rings is about 84 mm in height. The fifth outermost hollow cylinder (5) is about 94 mm in outer diameter. The sixth outermost hollow cylinder (6) is about 81 mm in outer diameter. The seventh outermost hollow cylinder (7) is about 69 mm in outer diameter. The eighth outermost hollow cylinder (8) is about 57 mm in outer diameter.

Figure 2:
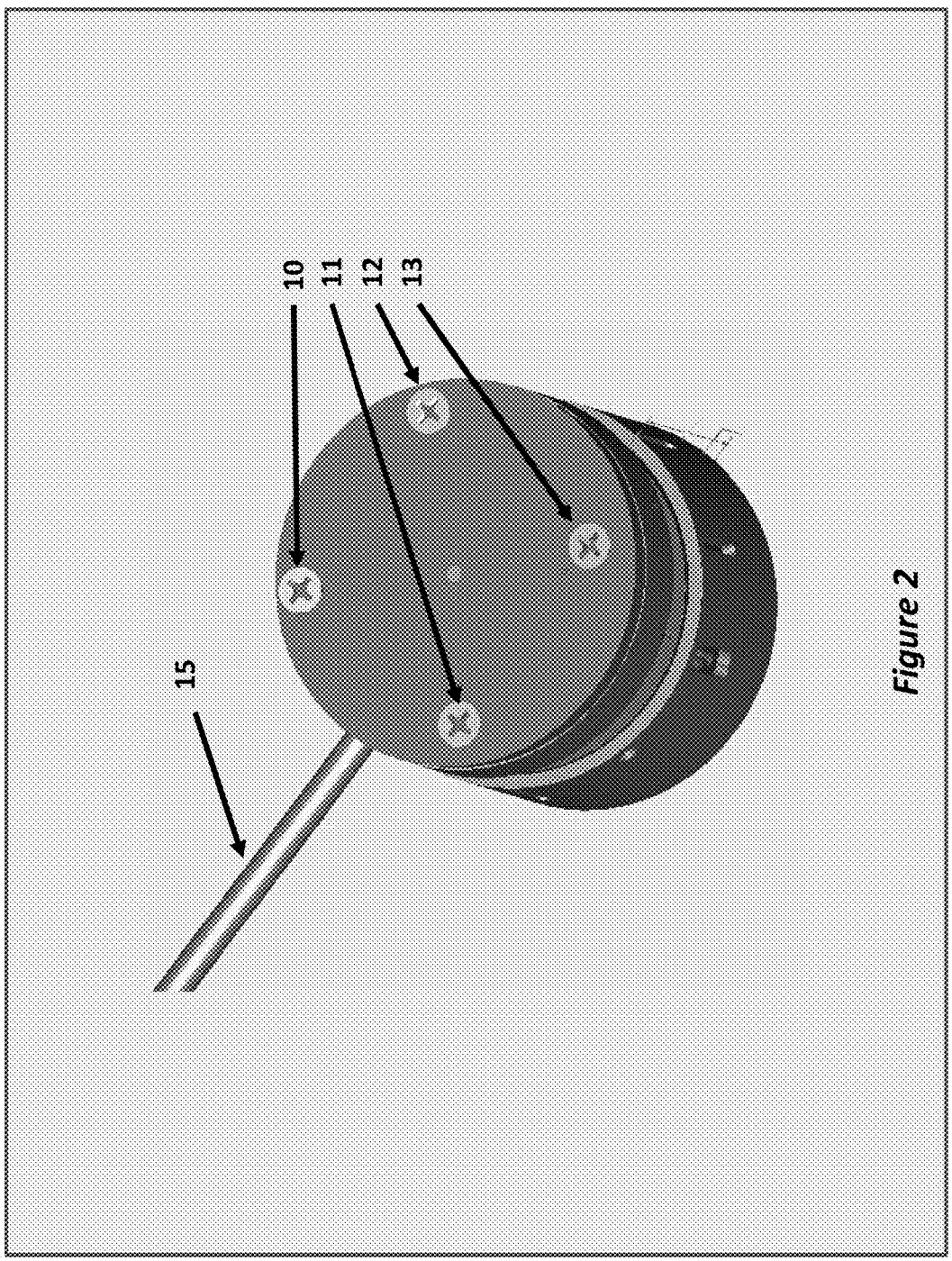
FIG. 2 is a bottom perspective view of a convertible hotplate adapter in accordance with aspects of the present invention.

This embodiment also comprises a pedestal ring (9) about 140 mm in outer diameter and 115 mm in inner diameter with a height of about 25 mm. As shown in FIG. 2, the pedestal ring (9) is comprised of threaded sockets providing for its attachment with screws or bolts (10, 11, 12 and 13) to a base (14) which is a disk about 140 mm in diameter and 12 mm in height also provided with holes for screw or bolts (10, 11, 12 and 13). The base (14) also comprises a threaded tapped hole about 6 mm in diameter, located at the center of the inner flat face of the disk. The pedestal ring also comprises a larger threaded/tapped hole positioned radially in the ring to receive a suspension rod (15) which is correspondingly threaded at one end.

Figure 3:
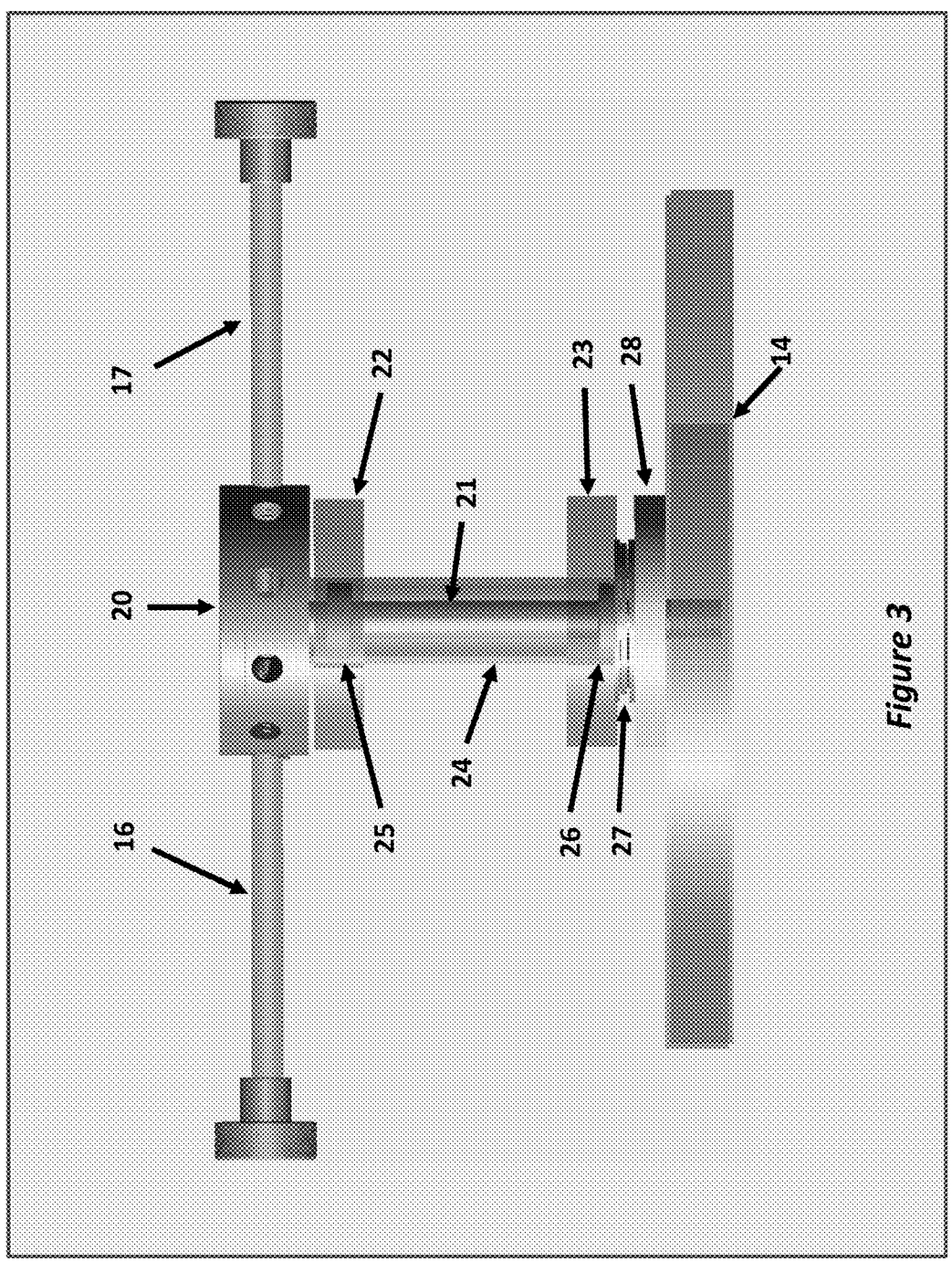
FIG. 3 is an elevation view of a convertible hotplate adapter in accordance with aspects of the present invention.

This embodiment also comprises two semi-fixed hanging rods (16 and 17) and two movable hanging rods (18 and 19) (see FIG. 1 and FIG. 3). Each of the hanging rods (16, 17, 18, and 19) is a cylinder about 5 mm in diameter and about 75 mm in length. On one end is affixed a small knob and the other end is threaded for about 10 mm of its length.

This embodiment also comprises a concentric cylindrical core situated centrally to the hollow-cylinder rings 1 through 8. This core comprises an apex disk (20) about 44 mm in diameter and about 15 mm in height. The exposed or upper face of the disk is substantially concave, the hollowed area approximating a spherical cap; the lower or inner face is substantially flat. Radially around the circumference of the apex disk (20), ten threaded/tapped holes are arranged in diametrically opposed pairs. Into a certain pair of diametrically opposed threaded/tapped holes are horizontally screwed semi-fixed hanging rod (16) and semi-fixed hanging rod (17) each threaded at one end to fit into the threaded sockets of the apex disk (20). The apex disk comprises a threaded tapped hole situated at the center of flat inner face of the disk. A central vertical rod (21) about 6 mm in diameter and about 100 mm in length is threaded at both ends to attach to the base (14) and to attach to the apex disk (20).

In FIG. 3 the central core of this embodiment is shown in a horizontal (elevation) view with the concentric hollow-cylinder rings (1 through 8) removed for clarity of view of the central core. The apex disk (20) is threaded at the center of its flatten face to receive the central vertical rod (21) which is, in turn, threaded at its opposite end to attach to the center of base (14). Two ferromagnetic-material-constructed disk-shaped rings, an upper (22) and a lower (23) each about 40 mm in outer diameter and 14 mm in inner diameter and 8 mm in height are diametrically magnetized, that is, with the poles of the magnet oriented perpendicular to the central axis of the disk. A preferred material of construction of the two ferromagnetic-material-constructed disk-shaped rings is a material with a high magnetic use temperature, exceeding 150° C., such as a samarium cobalt alloy or an iron ceramic material. The two magnetic disk-shaped rings (22) and (23) are affixed approximately flush with the ends of a hollow cylinder (24) about 24 mm in outer diameter and about 12 mm in inner diameter and about 48 mm in height. The magnet assembly consisting of the combination 22, 23 and 24 is free to rotate around vertical rod (21). Rotation is facilitated by two ball-bearing assemblies, an upper (25) and a lower (26). Rotation is further facilitated by a thrust bearing assembly comprising small roller-bearings (27). The roller thrust bearing assembly rests upon a thermal-insulating disk-shaped ring (28) which, in turn, rests upon the base (14).

The apex disk (20) comprises ten tapped holes about 6 mm in diameter arranged radially in five evenly-spaced diametrically opposed pairs around the circumference of the disk. Correspondingly, each of the concentric hollow nested cylinders (1, 2, 3, 4, 5, 6, 7 and 8) comprises ten cut-out slots or holes arranged radially in five evenly-spaced diametrically-opposed pairs around the circumference of the disk. These slots or holes are radially aligned through all of the cylinders such that when a rod or rods is place through the proper set of cut-out slots or holes and screwed to the apex disk (20) the weight of the cylinders will cause each cylinder to come to rest at an appropriate height such that the combination of nested cylinder's upper edges and inner sides will form a profile conforming to the profile of a hemisphere or other rounded object.

Figure 4:
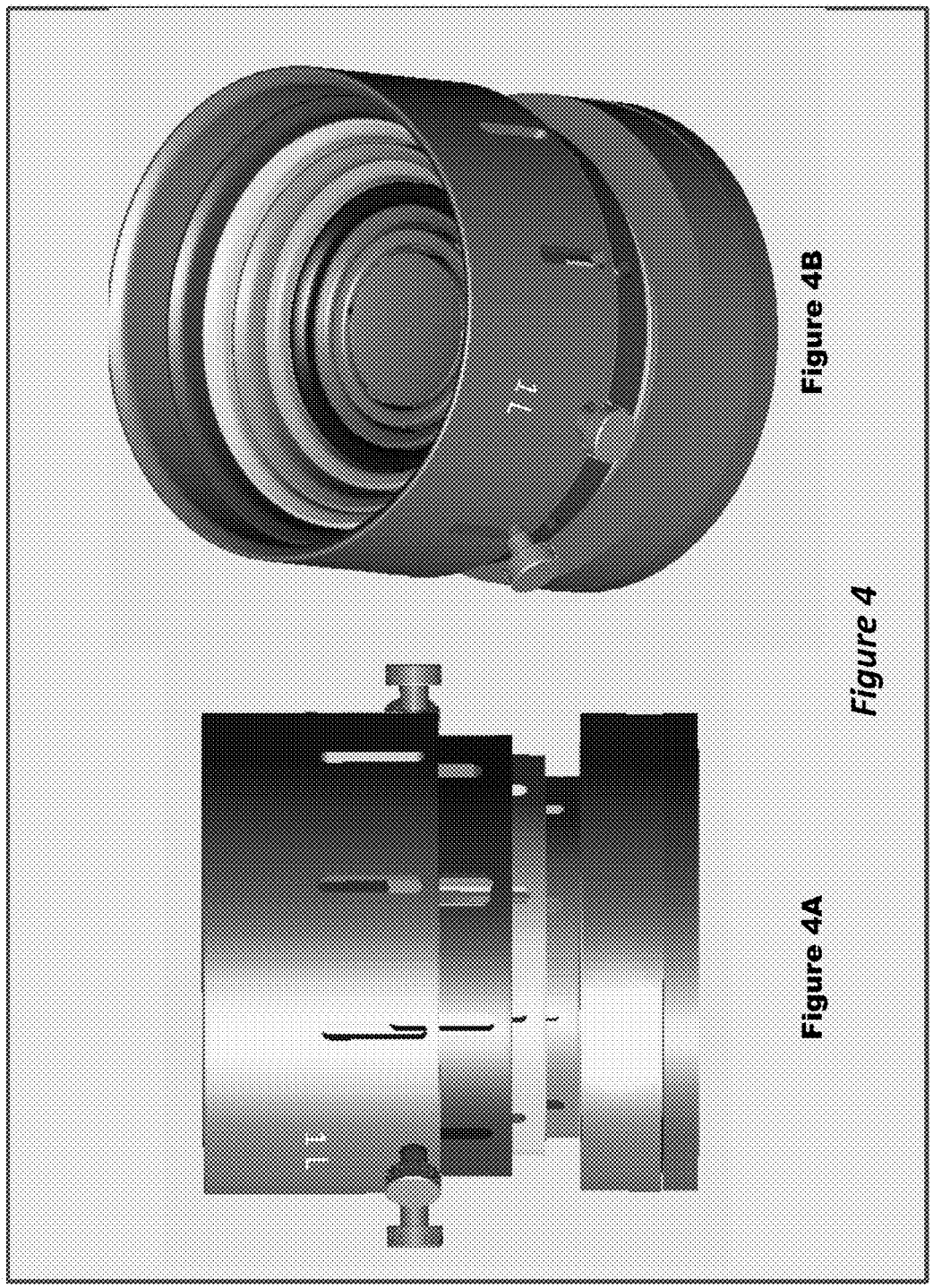
FIGS. 4A and 4B are respectively a lateral elevation view and upper perspective view of a convertible hotplate adapter in accordance with aspects of the present invention.

FIG. 4 illustrates two views of an embodiment of the invention with the upper edges of the nested cylinders arranged to conform to the profile of a typical 1.0 L-capacity, round-bottomed flask; the insertion of movable hanging rod or rods (18 and 19) through the appropriate set of slots causing the nested concentric cylinder rings to hang in the appropriate positions. The upper inner edge of each hollow cylindrical ring is chamfered or beveled and rounded in so as to produce a smooth contour and to substantially conform to the profile of a round-bottomed vessel.

Figure 5:
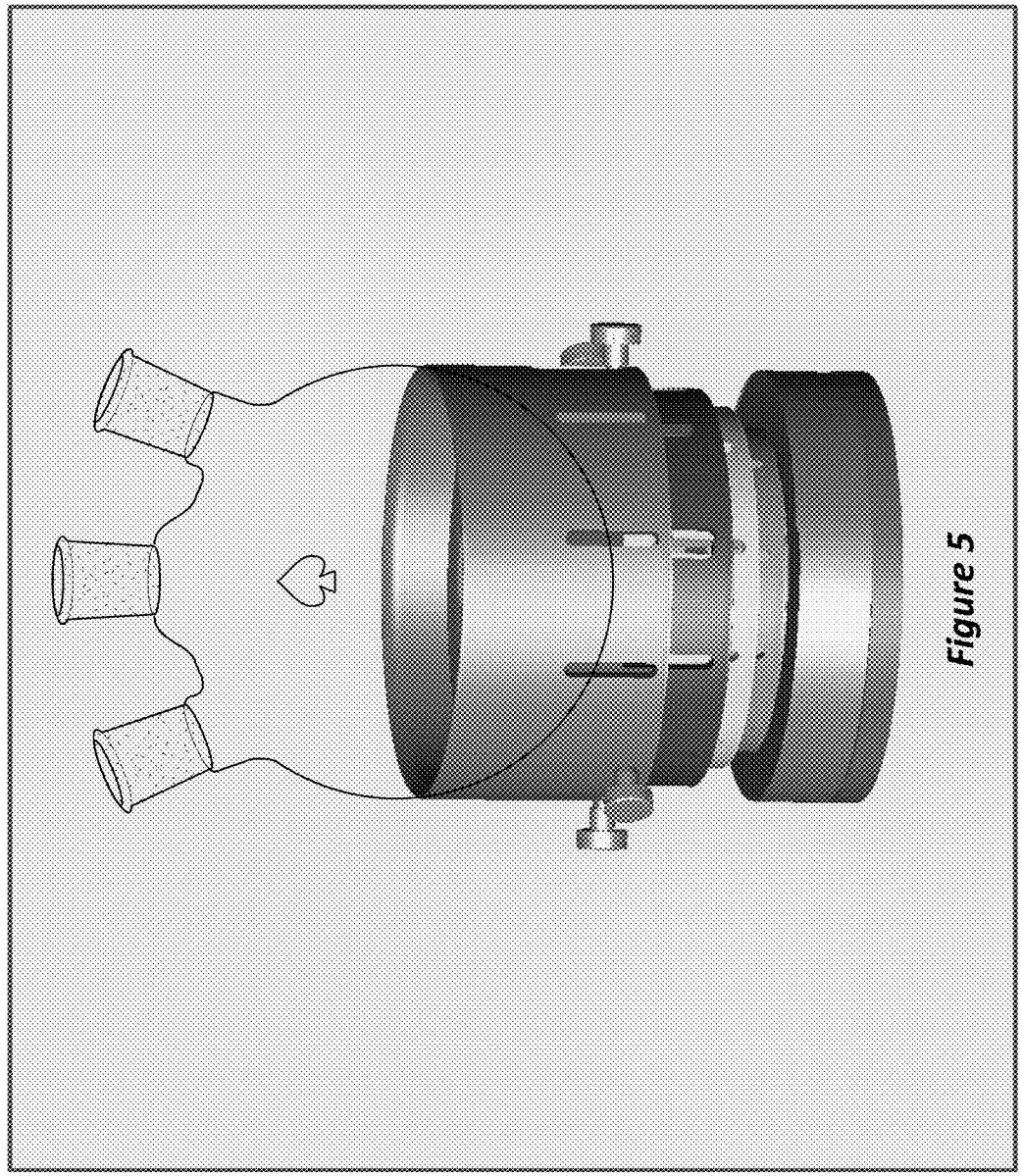
FIG. 5 is a lateral elevation view of a convertible hotplate adapter holding a round-bottom flask, in accordance with aspects of the present invention.
Figure 6:
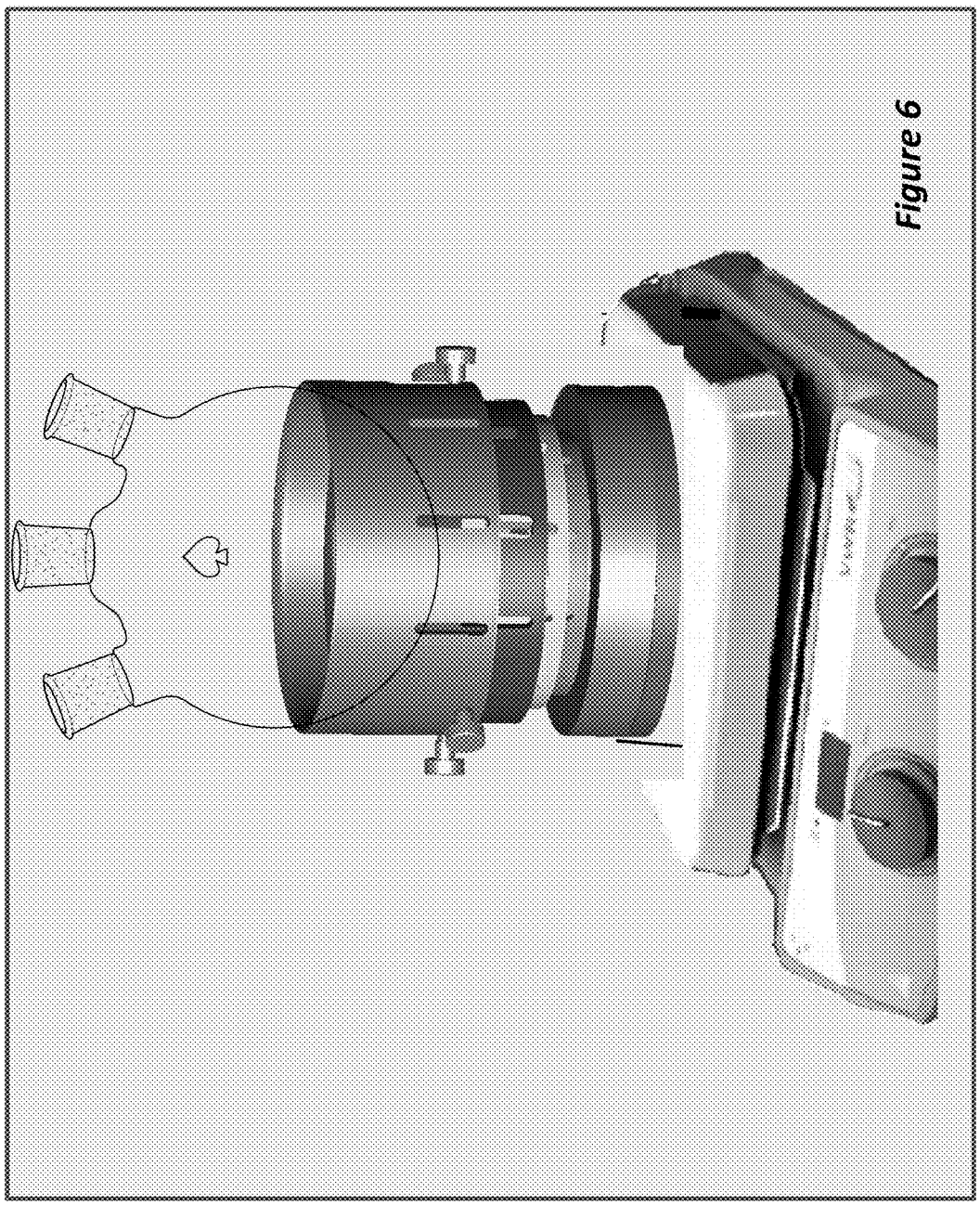
FIG. 6 is a lateral elevation view of a convertible hotplate adapter positioned on a hot plate and holding a round-bottom flask, in accordance with aspects of the present invention.

FIGS. 5, 6, and 7 illustrate how the present invention may be used in combination with a 1.0 L round-bottomed flask and with a hot plate. In addition, FIGS. 5, 6, and 7 also suggest how the device may be generally used in combination with other sizes of round bottomed flasks such as 500 mL, 250 mL and 100 mL capacity flasks.

FIG. 8 illustrates two views of an embodiment of the invention with the upper edges of the nested cylinders arranged to conform to the profile of a typical 500 mL capacity round-bottomed flask; the insertion of a rod or rods (18 and 19) through the appropriate set of slots causing the nested concentric cylinder rings to hang in the appropriate positions. The upper inner edge of each hollow cylindrical ring is chamfered or beveled and rounded in so as to produce a smooth contour and substantially conform to the profile of a round-bottomed vessel.

Figures 9, 9A, 9B:
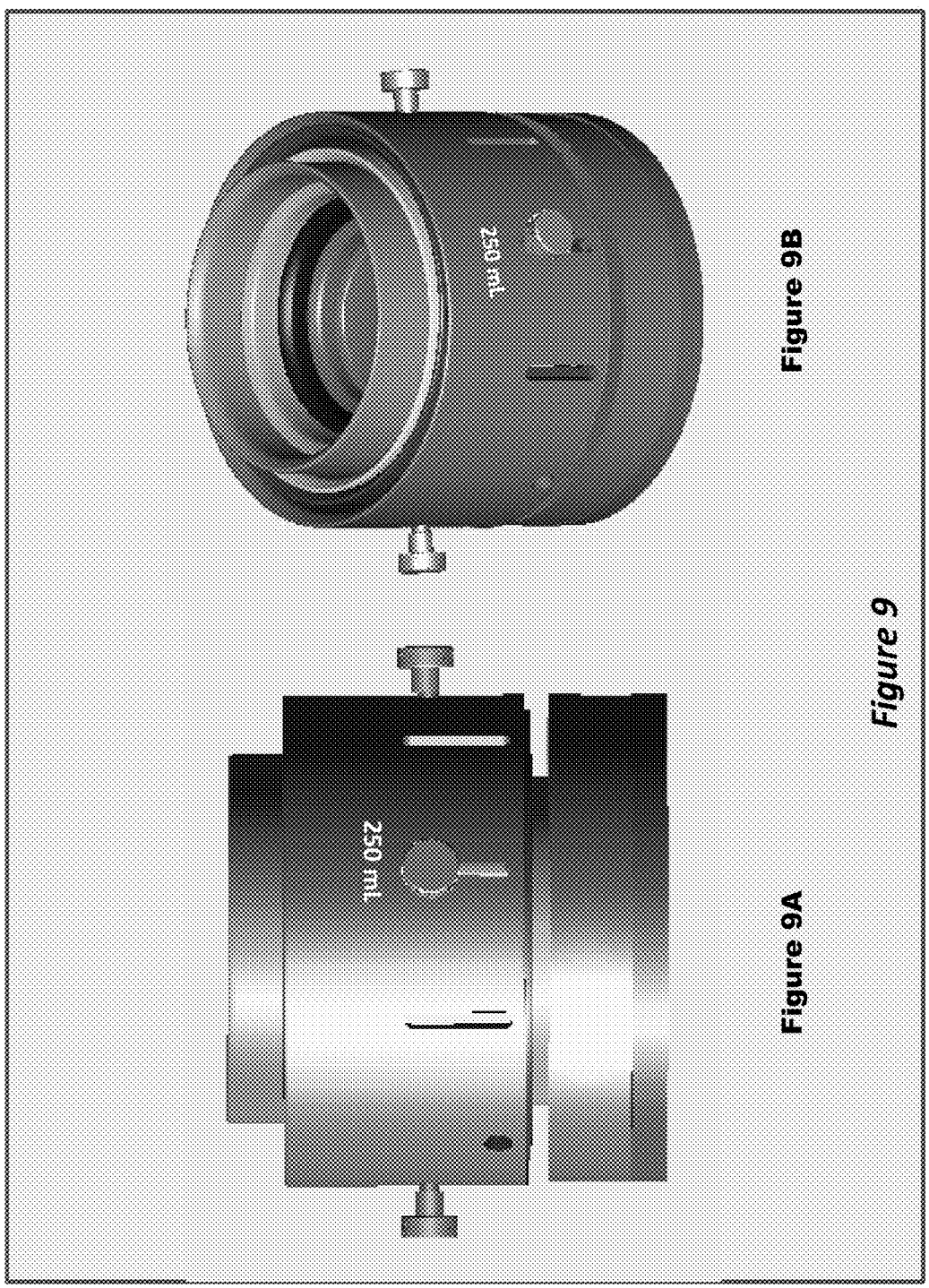
FIGS. 9A and 9B are respectively a lateral elevation view and upper perspective view of a convertible hotplate adapter in accordance with aspects of the present invention.

FIG. 9 illustrates two views of an embodiment of the invention with the upper edges of the nested cylinders arranged to conform to the profile of a typical 250 mL capacity round-bottomed flask; the insertion of a rod or rods (18 and 19) through the appropriate set of slots causing the nested concentric cylinder rings to hang in the appropriate positions. The upper inner edge of each hollow cylindrical ring is chamfered or beveled and rounded in so as produce a smooth contour and substantially conform to the profile of a round-bottomed vessel.

Figures 10, 10A, 10B:
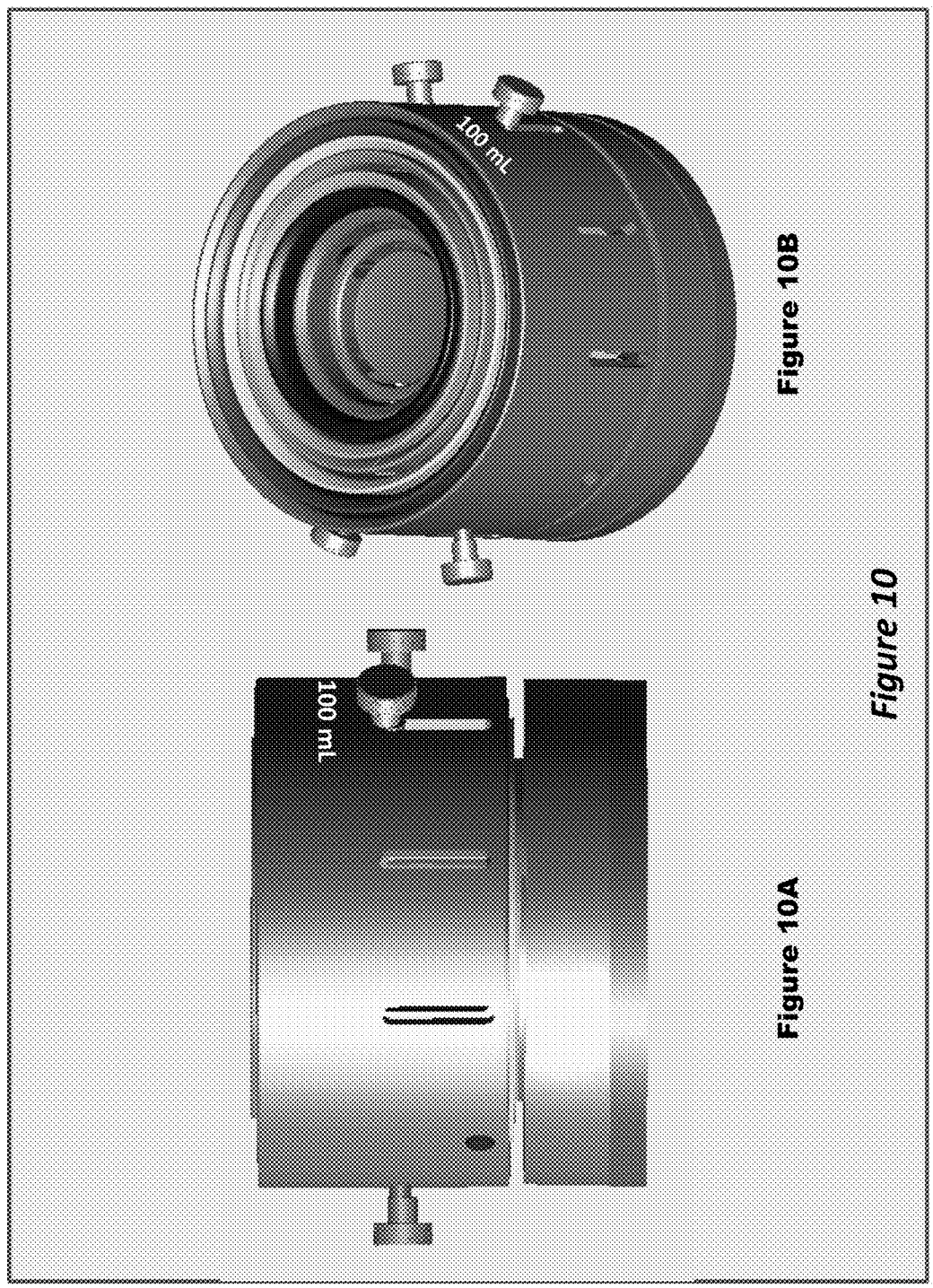
FIGS. 10A and 10B are respectively a lateral elevation view and upper perspective view of a convertible hotplate adapter in accordance with aspects of the present invention.

FIG. 10 illustrates two views of an embodiment of the invention with the upper edges of the nested cylinders arranged to conform to the profile of a typical 100 mL capacity round-bottomed flask; the insertion of a rod or rods (18 and 19) through the appropriate set of slots causing the nested concentric cylinder rings to hang in the appropriate positions. The upper inner edge of each hollow cylindrical ring is chamfered or beveled and rounded in so as to produce a smooth contour and substantially conform to the profile of a round-bottomed vessel.

In this embodiment of the present invention, the device may be transformed from being adapted to accommodate a flask of one of four different capacities, either 1.0 L, 500 mL, 250 mL, or 100 mL to then reversibly transform to accommodate a flask of one of the remaining three capacities. For example the device adapted to accommodate a 1.0 L capacity flask may be changed to accommodate a flask of 500 ml capacity and then reversed to again accommodate a 1.0 L flask.

This transformation is accomplished by first removing the movable rods (18 and 19). Then, the suspension rod (15) is screwed into the pedestal ring (9) and then the device is suspended by the suspension rod (15) from a ring stand or similar support apparatus in an inverted position, that is, in a position in which the concentric rings (1 to 8) are lower than the base (14). The weight of the concentric ring (1 to 8) will cause the said rings to fall into a "reset" position as determined by the position of sets of slots in the rings as the rings hang from hanging rods (16 and 17). Next, movable rods (18 and 19) are inserted into two diametrically opposed sets of slots corresponding to the new desired configuration of the device, that is, into sets of slots to accommodate a flask of either 1.0 L, 500 mL, 250 mL or 100 mL capacity. The movable rods are then screwed into tapped holes in the apex disk (20) and the device rotated 180° from the inverted position to the normal-use position causing the concentric rings (1 to 8) to fall and hang in position to form the contours appropriate to substantially accommodate a flask of the desired capacity.

Another embodiment of the present invention may comprise a thermocouple integrated with the device or inserted in slots or holes in the device such that the thermocouple probe may be plugged by means of a thermocouple pair of wires into the external temperature control of a hotplate or similar device.

Another embodiment of the present invention may comprise additional sets of slots and holes in the concentric hollow cylinders as well as separate larger concentric hollow cylinders resting directly upon a hotplate surface so as to accommodate flasks of larger capacity including 2.0 L and 3.0 L capacity round-bottomed flasks.

While particular embodiments of the present invention have been illustrated and described, it would be obvious to those skilled in the art that various other changes and modifications can be made without departing from the spirit and scope of the invention. It is therefore intended to cover in the appended claims, which themselves constitute part of the disclosure, all such changes and modifications that are within the scope of this invention.

The following references are hereby incorporated herein by reference:

U.S. Pat. Documents

| | | |
|---|---|---|
| 3,784,170 | January 1974 | Peterson et al. |
| 4,054,270 | October 1977 | Gugger et al. |
| 4,080,663 | March 1978 | Wik |
| 4,090,263 | May 1978 | Hoffa |
| 4,131,370 | December 1978 | Lawrence et al. |
| 4,199,265 | April 1980 | Sanderson et al. |
| 4,214,874 | July 1980 | White |
| 4,227,815 | October 1980 | Hoffa |
| 4,390,283 | June 1983 | Meyer |
| 4,568,195 | February 1986 | Herz et al. |
| 4,752,138 | June 1988 | Rufer |
| 4,759,635 | July 1988 | MacMichael et al. |
| 4,830,511 | May 1989 | Smazik |
| 4,876,069 | October 1989 | Jochimsen |
| 4,911,555 | March 1990 | Saffer et al. |
| 4,991,973 | February 1991 | Maaz et al. |
| 5,529,391 | June 1996 | Kindman et al. |
| 5,899,567 | May 1999 | Morris, Jr. |
| 5,911,503 | June 1999 | Braden et al. |
| D,426,312 | June 2000 | Gomes |
| 6,508,582 | January 2003 | Friedman |
| 6,659,637 | December 2003 | Friedman |
| 6,733,171 | May 2004 | Schob |
| 6,905,656 | June 2005 | Ladlow et al. |
| 6,962,433 | November 2005 | Nichols et al. |
| 6,988,825 | January 2006 | Coville et al. |
| 7,075,040 | July 2006 | McFadden et al. |
| 7,153,021 | December 2006 | Goodwin et al. |
| 7,364,350 | April 2008 | Coville et al. |
| 7,494,267 | February 2009 | Ware |
| 8,398,297 | March 2013 | Dettling et al. |
| 2004/0151065 | August 2004 | Nichols et al. |
| 2011/0038224 | February 2011 | Dettling et al. |

Foreign Patent Documents

| | | |
|---|---|---|
| 2 201 204 | May 1973 | DE |
| 81 06 555.8 | December 1981 | DE |
| 30 43 335 | June 1982 | DE |
| 1201297 | May 2002 | EP |
| 156206 | June 1969 | GB |
| WO 91/10503 | July 1991 | WO |

OTHER REFERENCES

Texas Instruments, Data Sheet for Single Schmitt-Trigger Inverter, SN74LVC1G14, SCE218C—April 1999—Revised February 2000, pp. 1-8, Texas Instruments, Dallas, Tex.

Allegro Microsystems, Inc., Data Sheet for Microstepping DMOS Driver with Translator, A3979, pp. 1-14, Allegro Microsystems, Inc., Worcester, Mass., www.allegromicro.com.

National Semiconductor Corporation, Data Sheet for LM117/LM317A/LM317 3—Terminal Adjustable Regulator, 9063, Oct. 20, 2008, pp. 1-28, National Semiconductor Americas Technical Support Center, www.national.com.

Linear Technology Corporation, Data Sheet for LTC1440/LTC1441/LTC1442 Ultralow Power Single/Dual Comparator with Reference, 144012fd, pp. 1-16, Linear Technology Corporation, Milpitas, Calif., www.linear.com, 1996.

Maxim Integrated Products, Data Sheet for MAX1615/MAX1616 High-Voltage, Low-Power Linear Regulators for Notebook Computers, 19/1225; Rev 3; September 2004, pp. 1-8, Maxim Integrated Products, Sunnyvale Calif., www.maxim-ic.com/packages.

International Search Report and Written Opinion mailed Jan. 4, 2012 for PCT/US2010/039614 filed Jun. 23, 2010.

International Preliminary Report on Patentability mailed Feb. 14, 2012 for PCT/US2010/039614 filed Jun. 23, 2010.

What is claimed is:

1. A device to facilitate the heating of rounded vessels and other rounded objects comprising:
   a plurality hollow cylinders in a nested, concentric arrangement, each of said hollow cylinders having respective upper edges and inner sides, and said hollow cylinders moveable longitudinally with respect one another, such that said upper edges may be arranged and fixed into at least two configurations wherein at least two of said upper edges of said hollow cylinders form respective at least two spherical section contours of at least two respective different sizes, and so as to be adapted to contact rounded vessels or other rounded objects of two respective different sizes.

2. The device according to claim 1 wherein said hollow cylinders comprise:
   a heat-conducting metal selected from the group consisting of silver, copper, bronze, titanium, aluminum and aluminum alloys.

3. The device according to claim 2 wherein said heat-conducting metal is selected from the group consisting of heat-conducting metals that are polished, anodized or colored.

4. The device according to claim 1 additionally comprising:
   a concentric cylindrical core disposed centrally to said hollow cylinders.

5. The device according to claim 4 wherein said concentric cylindrical core has a concave rounded face.

6. The device according to claim 4 wherein said concentric cylindrical core comprises:
   a magnetic stirrer comprising a mechanism for creating a rotating magnetic field.

7. The device according to claim 1 wherein said plurality of hollow cylinders comprise:
   cut-out slots or holes radially aligned through at least some of said plurality of hollow cylinders, said cut-out slots or holes adapted to accept a rod such that when a rod is placed through said cut-out slots or holes, said hollow cylinders will be maintained in one of said at least two configurations.

8. The device according to claim 1 wherein said plurality of hollow cylinders comprise:
   two or more sets of cut-out slots or holes radially aligned through at least some of said plurality of hollow cylinders such that when a rod is placed through a first of said sets of cut-out slots or holes, said hollow cylinders will be maintained in one of said at least two configurations, and when a rod is placed through a second of said sets of cut-out slots or holes, said hollow cylinders will be maintained in a second of said at least two configurations.

9. The device according to claim 1 wherein said plurality of hollow cylinders has a central longitudinal axis, and additionally comprising a hollow pedestal cylinder ring from ¼ to 4 inches in height and having its central aperture disposed along said central longitudinal axis and with a difference in inner and outer diameters of ¼ to 3 inches, and composed of heat conducting material, so as to facilitate heat transfer from a flat heating surface through said plurality of hollow cylinders of said device to a rounded object, when said flat heating surface and said rounded object are placed in contact with said device.

10. The device according to claim 1 additionally comprising an apex disk disposed centrally to said plurality of hollow cylinders and composed of heat-conducting material, and further comprising a hollow pedestal base and a central shaft connecting said apex disk to said hollow pedestal base.

11. The device according to claim 1, said device being in combination with a vessel having a spherical section contoured surface and containing a magnet, said spherical section contoured surface in contact with at least two of said respective upper edges of said plurality of hollow cylinders; and further in combination with a magnetic stirring device upon which said plurality of hollow cylinders is disposed so as to be adapted to stir the contents of said vessel.

12. The combination according to claim 11 wherein said magnetic stirring device additionally comprises a common axle or shaft having a longitudinal axis and to which are rotatably attached two or more magnets each having respective magnetic poles, and being attached such that said magnetic poles are aligned perpendicular to said longitudinal axis of said axle or shaft.

13. The combination according to claim 11 wherein said magnetic stirring device additionally comprises a common axle or shaft having a longitudinal axis and to which are rotatably attached two or more magnets adapted to rotate such that their rotating magnetic poles define respective rotating magnetic field planes, and being attached such that said longitudinal axis is disposed perpendicular to one of said rotating magnetic field planes.

14. The combination according to claim 12 wherein said common axle comprises a hollow cylindrical axle.

15. The device according to claim 11 wherein said magnetic stirring device comprises magnets with use temperatures greater than 150° C. and which are selected from the group consisting of samarium cobalt and rare-earth magnets.

16. The combination according to claim 11 wherein said magnetic stirring device comprises magnets which are ring shaped or round and diametrically polarized that is magnetized along the diameter of the disk or ring.

17. The combination according to claim 12 wherein said magnetic stirring device comprises a thrust bearing disposed upon a thermal-insulating disk-shaped ring.

18. The device according to claim 1 comprising a temperature sensor selected from the group consisting of thermometers and thermocouples.

19. The device according to claim 1 in combination with a heating surface or hot plate upon which said device is supported.

20. The device according to claim 1 additionally comprising a rounded or spherical vessel in contact with at least two of said respective upper edges, and additionally comprising in combination a heating surface or hot plate upon which said device is supported.

21. The device according to claim 1, wherein said plurality of hollow cylinders comprises from three to eight concentric hollow cylinders.

22. The device according to claim 7, additionally comprising a rod extending through said cut-out slots or holes such that said hollow cylinders are maintained in one of said at least two configurations.

23. The device according to claim 8, additionally comprising a rod extending through either of said first or second set of cut-out slots or holes such that said hollow cylinders are maintained respectively in either of said first or second of said at least two configurations.

\* \* \* \* \*